(12) United States Patent
Kononchuk et al.

(10) Patent No.: US 11,276,605 B2
(45) Date of Patent: Mar. 15, 2022

(54) PROCESS FOR SMOOTHING THE SURFACE OF A SEMICONDUCTOR-ON-INSULATOR SUBSTRATE

(71) Applicant: Soitec, Bernin (FR)

(72) Inventors: Oleg Kononchuk, Theys (FR); Didier Landru, Le Champ-près-Froges (FR); Nadia Ben Mohamed, Echirolles (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 16/473,475

(22) PCT Filed: Jan. 10, 2018

(86) PCT No.: PCT/EP2018/050558
§ 371 (c)(1),
(2) Date: Jun. 25, 2019

(87) PCT Pub. No.: WO2018/130568
PCT Pub. Date: Jul. 19, 2018

(65) Prior Publication Data
US 2019/0348319 A1    Nov. 14, 2019

(30) Foreign Application Priority Data
Jan. 13, 2017    (FR) ...................................... 1750300

(51) Int. Cl.
*H01L 21/762*    (2006.01)
*H01L 21/324*    (2006.01)

(52) U.S. Cl.
CPC .... *H01L 21/76254* (2013.01); *H01L 21/3247* (2013.01)

(58) Field of Classification Search
CPC ................................................ H01L 21/76254
See application file for complete search history.

(56) References Cited

U.S. PATENT DOCUMENTS 8,163,628 B2*    4/2012    Yamazaki ......... H01L 21/76254
                                                         438/458
8,876,173 B2*    11/2014    Igarashi .................. E05F 11/02
                                                         292/144

(Continued)

FOREIGN PATENT DOCUMENTS

JP        2000-294754 A        10/2000
JP        2008-182203 A         8/2008

(Continued)

OTHER PUBLICATIONS

European Communication for European Application No. 18700158.1 dated Aug. 22, 2019, 4 pages.

(Continued)

*Primary Examiner* — Yu-Hsi D Sun
(74) *Attorney, Agent, or Firm* — TraskBritt

(57) ABSTRACT

A method of fabricating a semiconductor substrate includes the following activities: a) providing a donor substrate with a weakened zone inside the donor substrate, the weakened zone forming a border between a layer to be transferred and the rest of the donor substrate, b) attaching the donor substrate to a receiver substrate, the layer to be transferred being located at the interface between the donor substrate and the receiver substrate; c) detaching the receiver substrate along with the transferred layer from the rest of the donor substrate, at the weakened zone; and d) at least one step of smoothing the surface of the transferred layer, wherein the semiconductor substrate obtained from step c) is kept, at least from the moment of detachment until the end of the smoothing step, in a non-oxidizing inert atmosphere or in a mixture of non-oxidizing inert gases. Semiconductor substrates are fabricated using such a method.

18 Claims, 2 Drawing Sheets

(56) References Cited

U.S. PATENT DOCUMENTS

| | | |
|---|---|---|
| 2002/0058387 A1 | 5/2002 | Ito |
| 2007/0128840 A1 | 6/2007 | Chen et al. |
| 2009/0035920 A1 | 2/2009 | Neyret et al. |
| 2012/0003814 A1 | 1/2012 | Ries et al. |
| 2015/0303098 A1 | 10/2015 | Landru et al. |
| 2016/0233125 A1 | 8/2016 | Landru |
| 2017/0243781 A1* | 8/2017 | Peidous ............ H01L 29/40117 |
| 2018/0005872 A1* | 1/2018 | Thomas ............ H01L 21/76243 |

FOREIGN PATENT DOCUMENTS

| | | |
|---|---|---|
| JP | 2016-516304 | 4/2017 |
| TW | 201448046 A | 12/2014 |
| WO | 2005/024925 A1 | 7/2005 |

OTHER PUBLICATIONS

International Written Opinion for International Application No. PCT/EP2018/050558, dated Mar. 27, 2018, 6 pages.
International Search Report for International Application No. PCT/EP2018/050558, dated Mar. 27, 2018, 3 pages.
Taiwanese Office Action for Taiwanese Application No. 10820813290 dated Aug. 27, 2019, 12 pages.
European Communication pursuant to Article 94(3) EPC for European Application No. 18700158, dated Jul. 8, 2020, 5 pages.
Japanese Notice of Reasons for Rejections for Japanese Application No. 2019-529245 dated Nov. 16, 2021, 4 pages.

* cited by examiner

PROCESS FOR SMOOTHING THE SURFACE OF A SEMICONDUCTOR-ON-INSULATOR SUBSTRATE

CROSS-REFERENCE TO RELATED APPLICATIONS

This application is a national phase entry under 35 U.S.C. § 371 of International Patent Application PCT/EP2018/050558, filed Jan. 10, 2018, designating the United States of America and published in English as International Patent Publication WO 2018/130568 A1 on Jul. 19, 2018, which claims the benefit under Article 8 of the Patent Cooperation Treaty to French Patent Application Serial No. 1750300, filed Jan. 13, 2017.

TECHNICAL FIELD

The present disclosure relates to the field of semiconductor-on-insulator substrate fabrication and, more particularly, to a process allowing a thin semiconductor-on-insulator layer to be transferred onto a receiver substrate.

BACKGROUND

This type of semiconductor-on-insulator substrate may be obtained by means of a Smart Cut process. In this type of process, the layer is transferred onto the receiver substrate by propagating a fracture wave along an interface that is embrittled beforehand by ion implantation, during a thermal annealing operation.

After detachment, the surface of the transferred layer exhibits an RMS roughness of the order of 50-100 Å (5-10 nm).

However, in the context of the production of, for example, silicon-on-insulator (SOI) semiconductor substrates, extremely smooth silicon surfaces are desired. A typical desired roughness value is an RMS value of less than 3 Å (0.3 nm). In a Smart Cut process with layer transfer, it is therefore necessary to carry out smoothing treatments after detachment in order to obtain an acceptable end substrate.

There exist numerous processes in the prior art for smoothing surfaces after detachment, but two are used above all. The first is a mechanical polishing technique, known as "chemical-mechanical polishing (CMP)" that allows the roughness to be removed locally but negatively affects the uniformity of the thickness of the transferred layer on the wafer scale.

The second is a high-temperature treatment under a neutral or reducing atmosphere or else under a corrosive atmosphere. Smoothing is then based on the reorganization of the surface by virtue of the high mobility of surface atoms at high temperature. In the case of a silicon layer, these temperature-based treatments are effective only above 900° C. since it is necessary first to break down the surface native oxide layer, either by etching it or by evaporating it.

Thus, producing semiconductor substrates for which control of the uniformity in thickness of the transferred silicon layer is critical requires the use of thermal smoothing treatments at temperatures higher than 900° C.

However, for certain products, the exposure to high temperatures during finishing is harmful. This is the case, for example, for structures containing alloy layers (e.g., SiGe) or heavily doped layers, where the high temperatures may lead to a diffusion of atomic species that is harmful to the product. The high temperature (HT) smoothing annealing operations are liable to modify the morphology of the oxygen precipitates in the silicon and thus to modify the mechanical and electrical properties of the material. Lastly, the exposures to high temperatures generate "slipline" or "boatmark" structural defects, which are linked to the high-temperature propagation under stress of dislocations through the substrates.

Although various methods have been proposed for the purpose of removing the roughness of the surface of the transferred layer obtained by means of the Smart Cut process while maintaining the uniformity in thickness of the layer, an improved solution is desired.

BRIEF SUMMARY

The object of the disclosure is therefore to overcome the drawbacks described above by providing a process making it possible to fabricate a semiconductor-on-insulator substrate including a thin layer transferred by means of the Smart Cut technique having a lower degree of roughness and an improved uniformity in thickness by virtue of a step of smoothing the surface after detachment that may be carried out at lower temperatures than those required by the currently known processes.

The object of the disclosure is achieved by a process for fabricating a semiconductor substrate including a thin layer transferred using the following steps:

a) providing a donor substrate with a weakened zone inside the donor substrate, the weakened zone forming the border between the thin layer to be transferred and the rest of the donor substrate; and b) attaching the donor substrate to a receiver substrate, the thin layer to be transferred being located at the interface between the donor substrate and the receiver substrate; and c) detaching the receiver substrate along with the transferred thin layer from the rest of the donor substrate, at the weakened zone.

This process comprises, after detachment step c), at least one step d) of smoothing carried out on the surface of the transferred thin layer, and the semiconductor substrate obtained from step c) is kept, at least from the moment of detachment until the end of the smoothing step, in a non-oxidizing inert atmosphere or in a mixture of non-oxidizing inert gases.

The treatment for smoothing the thin layer transferred onto a conductive substrate after detachment, when the thin layer transferred onto the conductive substrate is maintained in a non-oxidizing inert atmosphere or in a mixture of non-oxidizing inert gases, at least from the moment of detachment until the end of the smoothing step, makes it possible to obtain a surface of the transferred thin layer that is quite smooth on the wafer scale with an improved uniformity in thickness compared to the CMP techniques known from the prior art.

In addition, the fact that the transferred thin layer remains under a neutral atmosphere, at least from the moment of detachment until the end of the smoothing step, allows the smoothing step to be carried out at a lower temperature compared to the known prior art. This allows a wider choice of materials for the substrates and for the transferred thin layer for fabricating a semiconductor substrate.

In this context, the term "uniformity in thickness" refers to the maximum difference in thickness at the wafer level.

According to one variant of the process, the detachment and smoothing steps may be carried out in a non-oxidizing inert atmosphere or in a mixture of non-oxidizing inert gases, in particular, with a level of $O_2$ that is lower than 10 ppm. Once detachment has been achieved, the surface of the transferred layer is kept exposed to the gas forming the atmosphere of the oven of the detachment step, which is non-oxidizing. When the surface of a layer is exposed to free atmosphere, a natural oxide layer develops. Thus, if the atmosphere of the detachment step and of the smoothing treatment is non-oxidizing, the surface of the transferred thin layer is kept under a neutral atmosphere from the moment of detachment until the end of the smoothing treatment. Thus, there is no or little formation of an oxide layer on the surface of the transferred thin layer.

In one alternative of the process, the smoothing step may be carried out directly after the detachment step. Thus, the conditions subject to a neutral atmosphere are continuously provided. The specificity of the surface of the transferred thin layer just after fracturing is that it is yet to be oxidized by its environment. A surface-smoothing effect may be observed, since the surface atoms have a higher degree of mobility compared to a situation in which an oxide layer is present on the surface, thereby allowing the surface to reorganize itself by minimizing the surface energy.

In one variant of the process, the detachment step and the smoothing step may be carried out in one and the same device, in particular, in one and the same oven. This allows the two operations of detachment and smoothing to be combined within one and the same operation, thereby making the process simpler to carry out. The detachment step may be carried out by applying a thermal treatment to detach the weakened zone from the rest of the donor substrate.

In one variant of the process, the smoothing step may be carried out for at least 1 hour, preferably for 1 to 3 hours. The levels of smoothing obtained at 850° C. for 1 hour are comparable to those obtained by an RTA run at 1100° C. Rapid thermal annealing (RTA) is carried out in an RTA device that makes it possible to obtain speeds of temperature increase of over 10° C./s and relatively short annealing times, from about 30 seconds to 1 minute.

In one variant of the process, the smoothing step may be carried out within a temperature range from 650° C. to 900° C. Thus, the smoothing step may be carried out directly after detachment in the oven without need for cooling.

In one variant of the process, the RMS surface roughness of the transferred thin layer may be lower than 0.3 nm, in particular, over the entire surface, after the smoothing step.

The process is particularly suitable for the fabrication of FDSOI (fully depleted silicon on insulator) substrates.

The object of the disclosure may also be achieved by means of a semiconductor substrate fabricated using a process according to any one of the preceding claims, characterized in that the semiconductor substrate includes a transferred thin layer, the RMS surface roughness of the transferred thin layer being lower than 1 nm, in particular, over the entire surface.

BRIEF DESCRIPTION OF THE DRAWINGS

The disclosure may be understood by referring to the following description together with the appended figures, in which numerical references identify the elements of the disclosure.

DETAILED DESCRIPTION

Figure 1:
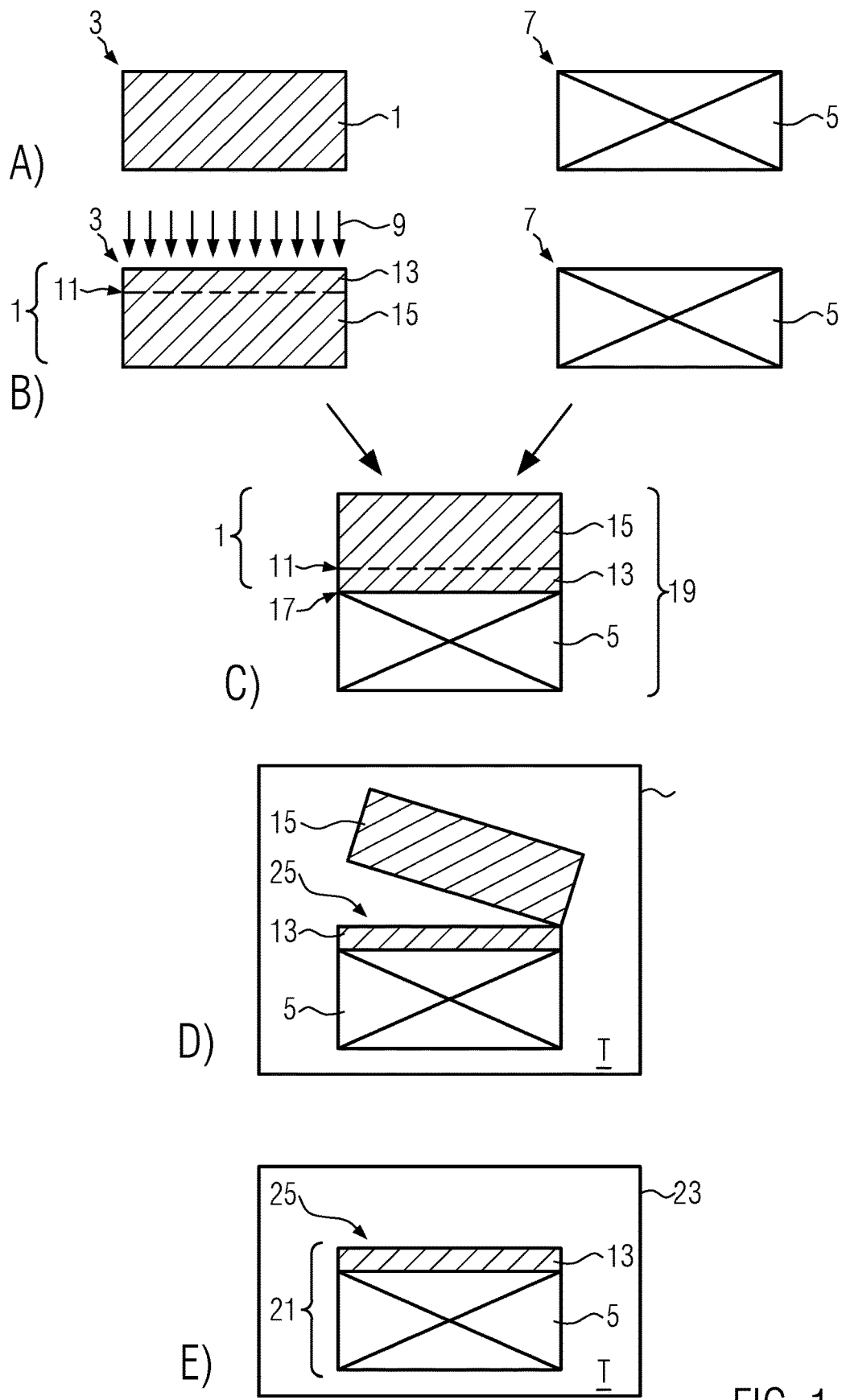
FIG. 1 schematically shows the various steps of the fabrication process according to one embodiment of the disclosure.

The fabrication process of the disclosure is described in detail by FIG. 1. It comprises the steps of formation, detachment and transfer of a thin layer from a donor substrate to a receiver substrate and a step of smoothing carried out on the surface of the transferred thin layer, in steps A to E.

FIG. 1A shows a donor substrate 1, preferably a silicon or monocrystalline silicon substrate, but also a germanium or silicon-germanium (SiGe) substrate, with or without its surface oxide, with a surface 3.

FIG. 1A shows a receiver substrate 5 with a surface 7. The receiver substrate 5 may be a silicon, a monocrystalline silicon, or else any other type of base substrate, in particular, a substrate that withstands temperatures higher than 700° C., with or without its surface oxide.

Next, such as illustrated in FIG. 1B, the donor substrate 1 is subjected to an implantation of ionic or atomic species 9. This implantation process introduces the implanted atomic species 9 into the donor substrate 1 with a maximum concentration at a predetermined depth of the donor substrate 1 with respect to the bombarded surface 3, with a view to creating a weakened zone 11. The weakened zone 11 forms the border between a thin layer 13 and the rest 15 of the donor substrate 1.

The implantation of ionic or atomic species 9 may be a single implantation operation, i.e., the implantation of a single atomic species, such as, for example, an operation of implanting hydrogen, helium or any other noble gas. The implantation may also be a co-implantation of ionic or atomic species 9, i.e., an operation of implanting at least two different species, such as, for example, the co-implantation of hydrogen and helium.

FIG. 1C shows the step in which the receiver substrate 5 is brought into contact, via one of its faces 7, with the face 3 of the donor substrate 1. The bond between the two substrates 1 and 5 is formed by molecular adhesion and the bond interface bears the reference 17 in order to form a multilayer stack 19.

FIG. 1D shows the step of detachment from the rest 15 of the donor substrate 1, along the weakened zone 11, so as to transfer the thin layer 13 onto the receiver substrate 5 in order to create the semiconductor substrate 21.

Detachment may be carried out by means of a thermal or a mechanical treatment, or else a treatment involving both a thermal treatment and a mechanical treatment.

By way of example, thermal detachment subjects the multilayer stack 19, illustrated in FIG. 1C, to thermal annealing, over the course of which a spontaneous detachment from the rest 15 of the donor substrate 1 takes place along the weakened zone 11. This thermal detachment operation is typically carried out in an oven 23 at temperatures between 100° C. and 600° C., preferably at about 500° C. In an alternative, a mechanical detachment operation may be achieved, for example, by using a blade on the weakened zone 11.

The atmosphere of the oven 23 is non-oxidizing, with levels of $O_2$ contamination of the order of 10 ppm or better. Thus, the surface 25 of the transferred thin layer 13 remains a surface free of surface oxide.

FIG. 1E shows the smoothing step according to the disclosure in which the smoothing of the surface 25 of the transferred thin layer 13 of the semiconductor substrate 21 is carried out by means of a thermal treatment in an oven. Here, the oven used is the same oven 23 as that already used for the step illustrated in FIG. 1D.

According to the disclosure, this thermal treatment is carried out at a temperature that is lower than 900° C., in particular, within a temperature range from 650° C. to 900° C., in a non-oxidizing inert atmosphere or a mixture of non-oxidizing inert gases, in particular, with a level of $O_2$ that is lower than 10 ppm. The one or more inert gases may be, for example, hydrogen, argon or xenon. The thermal treatment is applied for at least one hour, preferably from one to three hours.

The atmosphere between the steps must remain a non-oxidizing inert atmosphere in order to avoid the formation of a surface oxide.

The semiconductor substrate 21 exhibits an RMS roughness obtained for the surface 25 of the transferred thin layer 13 that is lower than 1 nm over the surface of the semiconductor substrate. The roughness measurements are, for example, carried out using an atomic force microscope (AFM) or by means of a haze measurement.

Figure 2:
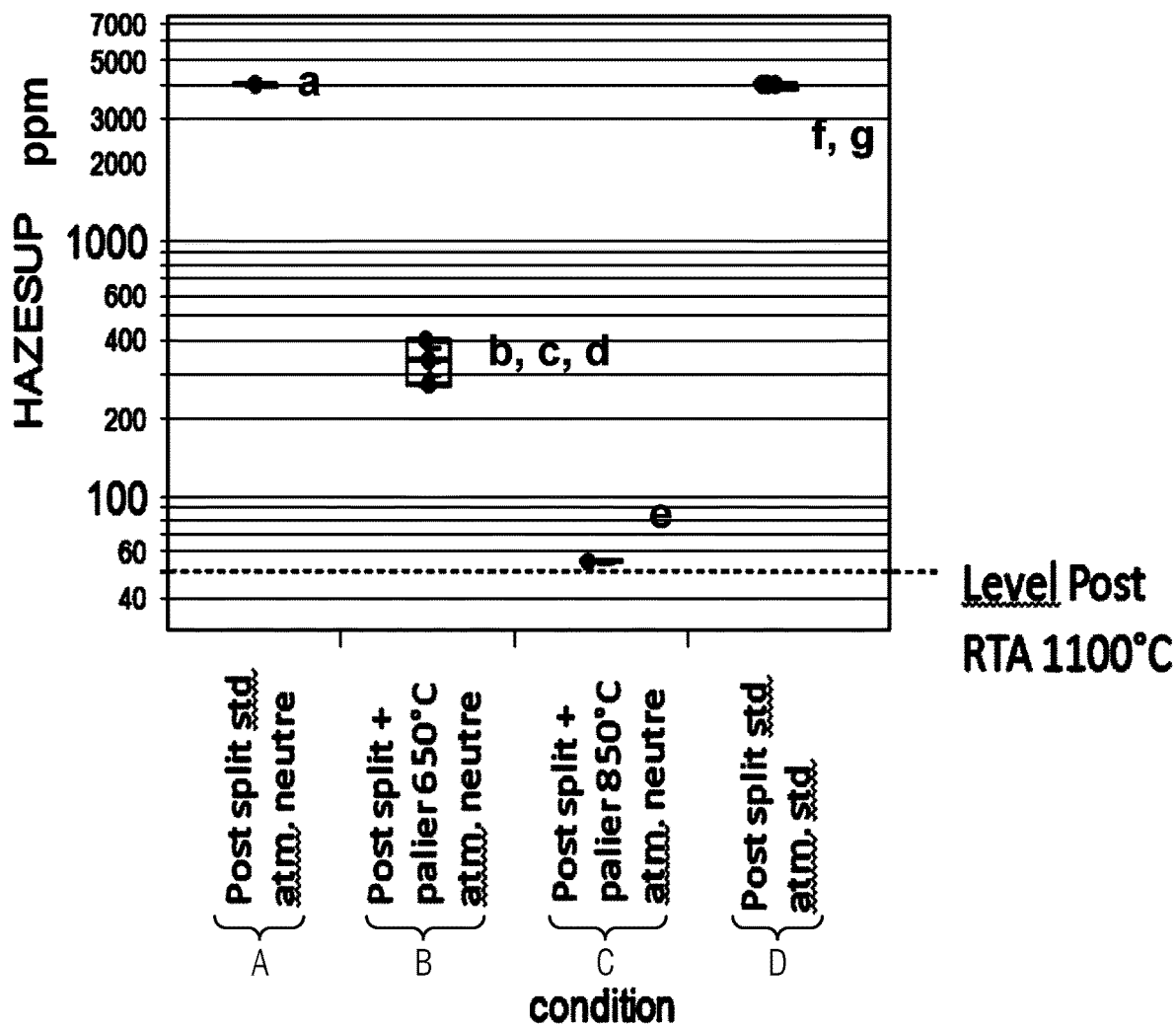
FIG. 2 shows the levels of roughness of substrates that have or have not undergone various types of smoothing operations after the detachment step.

FIG. 2 shows the levels of haze roughness reached for substrates that have or have not undergone various types of smoothing operations after the detachment step of the fabrication process according to the disclosure.

This haze value, measured in ppm, is the result of a method that uses the optical reflection properties of the surface to be characterized. A "HAZESUP" measurement corresponds to the maximum value of the haze on a wafer and is a very good indicator of the level of roughness of a substrate. The "HAZESUP" measurements illustrated in FIG. 2 have been made using an optical reflectometry instrument.

FIG. 2 shows the results of the "HAZESUP" measurements for seven substrates 21a to 21g, all of which have undergone the formation and detachment steps of the fabrication process according to the disclosure.

The substrate 21a exhibits a "HAZESUP" value of the order of 4000 ppm, having been measured directly after the detachment step, in a neutral atmosphere of argon alone with a level of $O_2$ that is lower than 10 ppm, condition A in FIG. 2.

The substrates 21b, 21c and 21d exhibit a "HAZESUP" value of between 280 ppm and 400 ppm, having been measured after a step of smoothing carried out at 650° C. for two hours in a neutral atmosphere of argon alone with a level of $O_2$ that is lower than 10 ppm, condition B in FIG. 2.

The substrate 21e exhibits a "HAZESUP" value of between 50 ppm and 60 ppm, having been measured after a step of smoothing carried out at 850° C. for two hours in a neutral atmosphere of argon alone with a level of $O_2$ that is lower than 10 ppm, condition C in FIG. 2. This level is comparable to a 30 s RTA thermal treatment, carried out at a temperature of 1100° C.

The substrates f and g exhibit a "HAZESUP" value of the order of 4000 ppm, having been measured directly after the detachment step, in ambient atmosphere, condition D in FIG. 2.

As was to be expected from the prior art, the substrates (here a, f and g) having undergone the formation and detachment steps without subsequently having undergone a thermal smoothing treatment exhibit high "HAZESUP" values, of the order of 4000 ppm, regardless of whether the "HAZESUP" measurements are carried out in ambient or a neutral atmosphere, while the substrates that have undergone a thermal smoothing treatment according to the disclosure after detachment exhibit a substantial decrease in the "HAZESUP" value (substrates b to e).

Thus, a smoothing operation carried out at 850° C. for 2 h (substrate e) gives a "HAZESUP" value of the same order as the "HAZESUP" value obtained after an RTA thermal treatment at 1100° C. for 30 s.

Thus, a degree of smoothing that is equivalent to that obtained for an RTA thermal treatment is obtained using a thermal smoothing treatment at 850° C., hence at a much lower temperature, in a non-oxidizing atmosphere and directly after having carried out detachment.

A certain number of embodiments of the invention have been described. However, it will be appreciated that various modifications and improvements may be made without departing from the scope of the following claims.

The invention claimed is:

1. A method of fabricating a semiconductor substrate including a transferred thin layer, the method comprising:
    providing a donor substrate with a weakened zone inside the donor substrate, the weakened zone forming a border between a thin layer to be transferred and the rest of the donor substrate; and
    attaching the donor substrate to a receiver substrate, the thin layer to be transferred being located at the interface between the donor substrate and the receiver substrate; and
    detaching the receiver substrate and the thin layer from the rest of the donor substrate, at the weakened zone, and forming a semiconductor substrate comprising the receiver substrate and a transferred thin layer; and
    at least one step of smoothing carried out on the surface of the transferred thin layer, in which the semiconductor substrate comprising the receiver substrate and a transferred thin layer is kept, at least from the moment of detachment until the end of the smoothing step, in a non-oxidizing inert atmosphere or in a mixture of non-oxidizing inert gases, wherein the at least one smoothing step is carried out at a temperature of 900° C. or less.

2. The method of claim 1, wherein the detaching of the receiver substrate and the thin layer from the rest of the donor substrate and the at least one step of smoothing are carried out in a non-oxidizing inert atmosphere or in a mixture of non-oxidizing inert gases.

3. The method of claim 2, wherein the non-oxidizing inert atmosphere or the mixture of non-oxidizing inert gases has a level of $O_2$ lower than 10 ppm.

4. The method of claim 3, wherein the at least one step of smoothing is carried out directly after detaching the receiver substrate and the thin layer from the rest of the donor substrate.

5. The method of claim 4, wherein the detaching of the receiver substrate and the thin layer from the rest of the donor substrate and the at least one step of smoothing are carried out in one and the same device.

6. The method of claim 5, wherein the detaching of the receiver substrate and the thin layer from the rest of the donor substrate and the at least one step of smoothing are carried out in one and the same oven.

7. The method of claim 6, wherein the at least one step of smoothing is carried out for at least one hour.

8. The method of claim 7, wherein the at least one step of smoothing is carried out for from one to three hours.

9. The method of claim 8, wherein the detaching of the receiver substrate and the thin layer from the rest of the donor substrate is carried out by applying a thermal treatment to the donor substrate to cause fracture along the weakened zone.

10. The method of claim 9, wherein the at least one smoothing step is carried out at a temperature of from 650° C. to 900° C.

11. The method of claim 10, wherein the donor substrate comprises at least one material selected from among silicon, monocrystalline silicon, germanium, and SiGe.

12. The method of claim 11, wherein the receiver substrate comprises at least one material selected from among silicon and monocrystalline silicon.

13. The method of claim 12, wherein a RMS surface roughness of the transferred thin layer is lower than 0.3 nm after the at least one smoothing step.

14. The method of claim 1, wherein the at least one step of smoothing is carried out directly after detaching the receiver substrate and the thin layer from the rest of the donor substrate.

15. The method of claim 1, wherein the detaching of the receiver substrate and the thin layer from the rest of the donor substrate and the at least one step of smoothing are carried out in one and the same device.

16. The method of claim 1, wherein the at least one step of smoothing is carried out for at least one hour.

17. The method of claim 1, wherein the detaching of the receiver substrate and the thin layer from the rest of the donor substrate is carried out by applying a thermal treatment to the donor substrate to cause fracture along the weakened zone.

18. The method of claim 1, wherein a RMS surface roughness of the transferred thin layer is lower than 0.3 nm after the at least one smoothing step.

* * * * *